United States Patent
Desai et al.

(10) Patent No.: US 11,255,918 B2
(45) Date of Patent: Feb. 22, 2022

(54) METHOD AND SYSTEM FOR ONLINE ESTIMATION OF SOH AND RUL OF A BATTERY

(71) Applicant: Tata Consultancy Services Limited, Mumbai (IN)

(72) Inventors: Saurabh Jaywant Desai, Pune (IN); Shashank Agarwal, Pune (IN); Venkataramana Runkana, Pune (IN); Aditya Pareek, Pune (IN); Muralikrishnan Ramanujam, Pune (IN)

(73) Assignee: Tata Consultancy Services Limited, Mumbai (IN)

( * ) Notice: Subject to any disclaimer, the term of this patent is extended or adjusted under 35 U.S.C. 154(b) by 0 days.

(21) Appl. No.: 17/142,037

(22) Filed: Jan. 5, 2021

(65) Prior Publication Data
US 2021/0247447 A1    Aug. 12, 2021

(30) Foreign Application Priority Data

Jan. 6, 2020 (IN) .............................. 202021000556

(51) Int. Cl.
*G01R 31/367* (2019.01)
*G01R 31/392* (2019.01)
*G06N 20/00* (2019.01)

(52) U.S. Cl.
CPC .......... *G01R 31/367* (2019.01); *G01R 31/392* (2019.01); *G06N 20/00* (2019.01)

(58) Field of Classification Search
CPC ..... G01R 31/367; G01R 31/392; G06N 20/00
See application file for complete search history.

(56) References Cited

U.S. PATENT DOCUMENTS

| | | | |
|---|---|---|---|
| 9,157,966 B2 | 10/2015 | Papana et al. | |
| 10,209,314 B2 | 2/2019 | Garcia et al. | |
| 2013/0138369 A1* | 5/2013 | Papana | B60L 58/12 702/63 |
| 2017/0115355 A1* | 4/2017 | Willard | G01R 31/392 |
| 2018/0143257 A1* | 5/2018 | Garcia | G01R 31/382 |
| 2018/0246173 A1* | 8/2018 | Singh | G01R 31/3828 |
| 2020/0284846 A1* | 9/2020 | Pajovic | G06N 20/00 |
| 2021/0055353 A1* | 2/2021 | Yazami | G01R 31/392 |

* cited by examiner

*Primary Examiner* — Raymond L Nimox
(74) *Attorney, Agent, or Firm* — Finnegan, Henderson, Farabow, Garrett & Dunner, LLP

(57) ABSTRACT

Performance and lifespan of batteries deteriorate with time due to various factors. Existing systems for battery management use different approaches for the battery management, and also rely on static value of parameters for State of Health (SOH) and Remaining Useful Life (RUL) estimation, thereby failing to consider current condition of the battery. The disclosure herein generally relates to battery management, and, more particularly, to a method and system for online battery management involving real-time estimation of State of Health (SOH) and Remaining Useful Life (RUL) of a battery, based on real-time data collected from the battery. The system determines state of the battery as one of charging, discharging, and rest. Further, corresponding to the determined state, the system determines values of one or more parameters, and processes the determined values with a battery performance model for online determination of the SOH and RUL.

15 Claims, 9 Drawing Sheets

METHOD AND SYSTEM FOR ONLINE ESTIMATION OF SOH AND RUL OF A BATTERY

PRIORITY CLAIM

This U.S. patent application claims priority under 35 U.S.C. § 119 to: India Application No. 202021000556, filed on Jan. 6, 2020. The entire contents of the aforementioned application are incorporated herein by reference.

TECHNICAL FIELD

This disclosure relates generally to battery management, and more particularly to a method and system for online battery management involving real-time estimation of State of Health (SOH) and Remaining Useful Life (RUL) of a battery, based on real-time data collected from the battery.

BACKGROUND

Battery is an integral part of all devices that are mobile. For example, devices such as but not limited to mobile phones, and cameras are equipped with rechargeable batteries. Performance and life span of such batteries deteriorates with time. A few examples of factors that affect performance and lifetime of batteries are cyclic life, temperature, recharge rate and so on. Battery management in this context refers to monitoring and assessing performance of a battery, and in turn estimating Remaining Useful Life (RUL) of the battery being monitored.

The inventors here have recognized several technical problems with such conventional systems, as explained below. Many state of the art systems/methods exist for performing the battery management. However, process adopted, and type of parameters considered by each methods may vary. Also, one disadvantage of the state of the art methods and systems for the battery management is that they rely on static values collected as input, for the purpose of the RUL estimation.

SUMMARY

Embodiments of the present disclosure present technological improvements as solutions to one or more of the above-mentioned technical problems recognized by the inventors in conventional systems. For example, in one embodiment, a processor implemented method for online battery management is provided. In this method, a real-time value of voltage and current of a battery being monitored are determined, via one or more hardware processors. Further a state of the battery is determined as one of charging, discharging, and rest, via the one or more hardware processors, based on the determined value of one of the current and voltage. Further, value of at least one of a cumulative charge ($Q_{char}$), a time elapsed ($T_{elap}$), Operation Time ($T_{opn}$), and Charging Time ($T_{opn\_ch}$) is determined based on the determined state of the battery, via the one or more hardware processors. Further, the determined value of the at least one of the $Q_{char}$, $T_{elap}$, $T_{opn}$, $T_{opn\_ch}$ is processed with a battery performance model, via the one or more hardware processors, and the processing involves determining correlation of the determined value of the at least one of the $Q_{char}$, $T_{elap}$, $T_{opn}$, and $T_{opn\_ch}$ with a battery performance model, determining a State of Health (SOH) of the battery based on the determined correlation, and determining a Remaining Useful Life (RUL) of the battery based on the determined SOH of the battery.

In another embodiment, a system for online battery management is provided. The system includes a memory storing instructions, one or more communication interfaces, and one or more hardware processors coupled to the memory via the one or more communication interfaces. The one or more hardware processors are configured by the instructions to determine real-time value of voltage and current of a battery being monitored. Further a state of the battery is determined as one of charging, discharging, and rest, via the one or more hardware processors, based on the determined value of one of the current and voltage. Further, value of at least one of a cumulative charge ($Q_{char}$), a time elapsed ($T_{elap}$), Operation Time ($T_{opn}$), and Charging Time ($T_{opn\_ch}$) is determined based on the determined state of the battery, via the one or more hardware processors. Further, the determined value of the at least one of the $Q_{char}$, $T_{elap}$, and $T_{opn}$, $T_{opn\_ch}$ is processed with a battery performance model, via the one or more hardware processors, and the processing involves determining correlation of the determined value of the at least one of the $Q_{char}$, $T_{elap}$, $T_{opn}$, and $T_{opn\_ch}$ with a battery performance model, determining a State of Health (SOH) of the battery based on the determined correlation, and determining a Remaining Useful Life (RUL) of the battery based on the determined SOH of the battery.

In yet another aspect, a non-transitory computer readable medium for battery management is provided. The non-transitory computer readable medium includes a plurality of instructions which when executed using one or more hardware processors, cause the one or more hardware processors to determine a real-time value of voltage and current of a battery being monitored. Further a state of the battery is determined as one of charging, discharging, and rest, via the one or more hardware processors, based on the determined value of one of the current and voltage. Further, value of at least one of a cumulative charge ($Q_{char}$), a time elapsed ($T_{elap}$), Operation Time ($T_{opn}$), and Charging Time ($T_{opn\_ch}$) is determined based on the determined state of the battery, via the one or more hardware processors. Further, the determined value of the at least one of the $Q_{char}$, $T_{elap}$, and $T_{opn}$, $T_{opn\_ch}$ is processed with a battery performance model, via the one or more hardware processors, and the processing involves determining correlation of the determined value of the at least one of the $Q_{char}$, $T_{elap}$, $T_{opn}$, and $T_{opn\_ch}$ with a battery performance model, determining a State of Health (SOH) of the battery based on the determined correlation, and determining a Remaining Useful Life (RUL) of the battery based on the determined SOH of the battery.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments. It is intended that the following detailed description be considered as exemplary only, with the true scope being indicated by the following claims.

Figure 1:
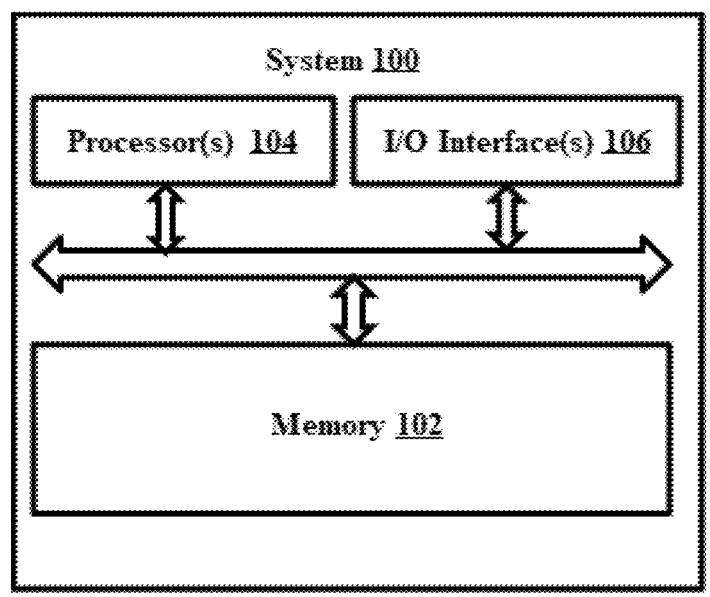
FIG. 1 illustrates an exemplary system for battery monitoring, according to some embodiments of the present disclosure.

FIG. 1 illustrates an exemplary system for battery monitoring, according to some embodiments of the present disclosure. In an embodiment, the system 100 includes a processor (s) 104, communication interface device(s), alternatively referred as input/output (I/O) interface(s) 106, and one or more data storage devices or a memory 102 operatively coupled to the processor (s) 104. In an embodiment, the processor (s) 104, can be one or more hardware processors (104). In an embodiment, the one or more hardware processors (104) can be implemented as one or more microprocessors, microcomputers, microcontrollers, digital signal processors, central processing units, state machines, logic circuitries, and/or any devices that manipulate signals based on operational instructions. Among other capabilities, the processor(s) 104 is configured to fetch and execute computer-readable instructions stored in the memory 102. In an embodiment, the system 100 can be implemented in a variety of computing systems, such as laptop computers, notebooks, hand-held devices, workstations, mainframe computers, servers, a network cloud and the like.

The I/O interface(s) 106 can include a variety of software and hardware interfaces, for example, a web interface, a Graphical User Interface (GUI), and the like and can facilitate multiple communications within a wide variety of networks N/W and protocol types, including wired networks, for example, LAN, cable, etc., and wireless networks, such as WLAN, cellular, or satellite. In an embodiment, the I/O interface (s) 106 can include one or more ports for connecting a number of devices to one another or to another server. For example, the I/O interface 106 enables the authorized user to access the system disclosed herein through the GUI and communicate with other similar systems 100.

The memory 102 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. Thus, the memory 102 may comprise information pertaining to input(s)/output(s) of each step performed by the processor(s) 104 of the system 100 and methods of the present disclosure.

The system 100 performs the online battery management. As part of the online battery management, the system 100 performs State of Health (SOH) and Remaining Useful Life (RUL) estimation of the battery. Steps in the SOH and RUL estimation, as performed by the system 100, are explained in description of FIG. 2 through FIG. 4.

Figure 2:
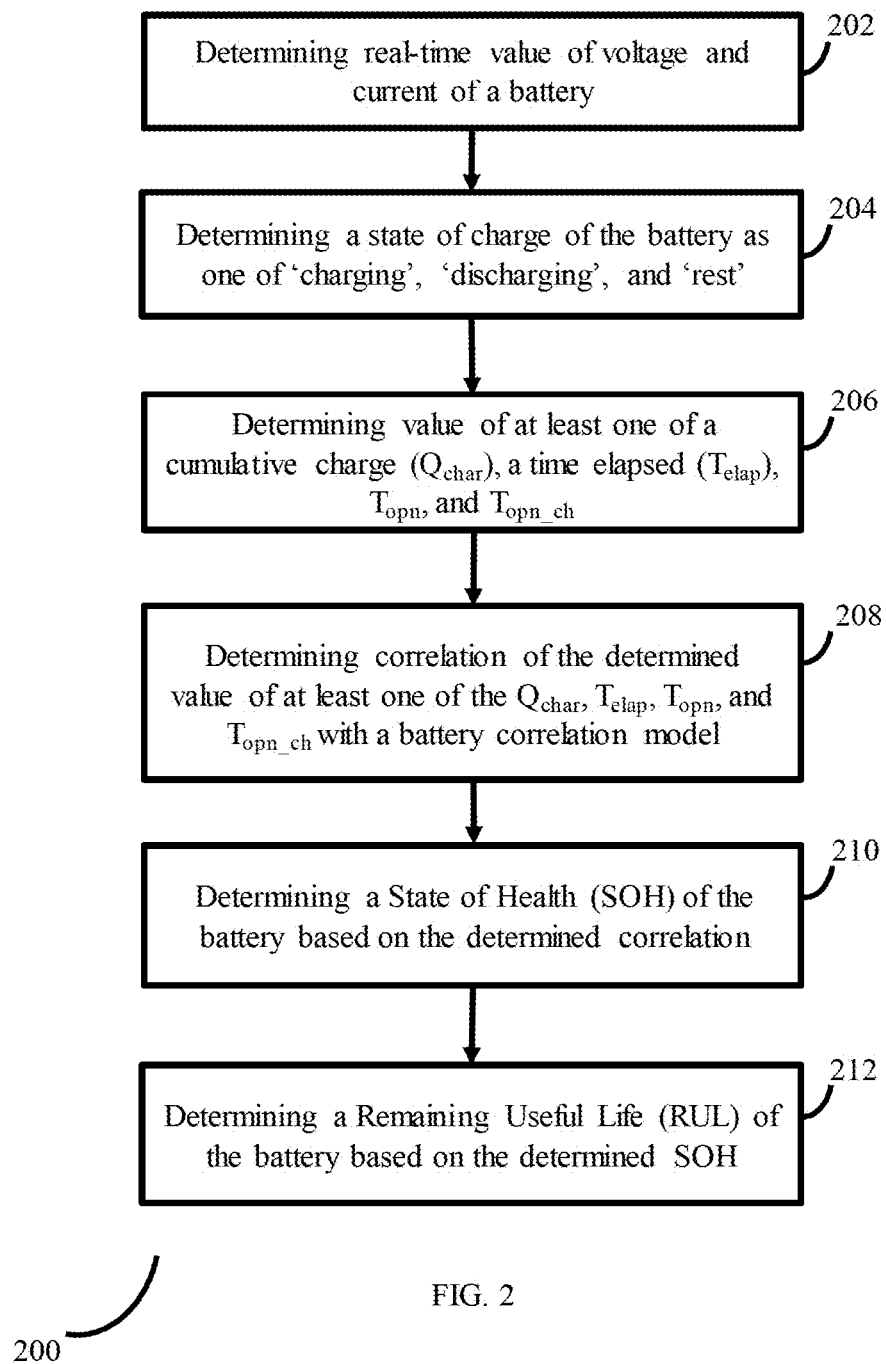
FIG. 2 is a flow diagram depicting steps involved in the process of determining State of Health (SOH) and Remaining Useful Life (RUL) of the battery, using the system of FIG. 1, according to some embodiments of the present disclosure.

FIG. 2 is a flow diagram depicting steps involved in the process of determining SOH and RUL of the battery, using the system of FIG. 1, according to some embodiments of the present disclosure. The system 100 performs an online monitoring of one or more batteries so as to determine SOH and RUL of the one or more batteries. The term 'online estimation' refers to capability of the system 100 to remotely connect with the batteries to collect real-time value of one or more parameters to determine the SOH and RUL, and also refers to capability of the system 100 to dynamically determine the SOH and RUL of the battery based on dynamically collected values of various parameters of the battery.

The system 100 generates a battery performance model, which is a machine learning data model that is generated using training data including operational data of at least one battery, SOH and RUL of the battery determined over a period of time, values of various parameters corresponding to each of the determined SOH and RUL and so on. Such data are collectively referred to as 'historical data' pertaining to operation of the battery. Every time such historical data is collected, the system 100 uses one or more appropriate techniques to clean the collected data. Cleaning of the data includes, but not limited to, synchronization of datasets, outlier removal, and imputation of data. The cleaning of the collected data is performed to fine-tune the collected historical data to obtain 'cleaned operational data' which is stored in the memory 101 and which is used for further processing to determine SOH and RUL of the battery at any given point of time. From the cleaned operational data, the SOH, State of Charge (SOC), RUL and so on are extracted as Key Variable Indicators (KVIs).

Further, the system 100 uses one or more feature engineering mechanisms to extract additional features, which along with the KVIs form training data for generating the battery performance model. Any appropriate machine learning technique may be used by the system 100 to process the training data and to build the battery performance model. The battery performance model is stored in a database in the memory 102, and may be updated from time to time using new training data.

Process of determining SOH and RUL of a battery is explained below. For convenience, the SOH and RUL estimation is explained by considering one battery. However, it is to be noted that the system 100 may perform the SOH and RUL estimation for more than one battery at a time. Also, the SOH and RUL estimation performed by the system 100 is an 'online estimation'. The term 'online estimation' in this context refers to capability of the system 100 to remotely connect with the batteries to collect real-time value of one or more parameters to determine the SOH and RUL, and also refers to capability of the system 100 to dynamically determine the SOH and RUL of the battery based on dynamically collected values of various parameters of the battery.

The system 100 can be connected to the battery using appropriate means such as but not limited to wired or wireless means, for example, a voltmeter and an ammeter are used. The voltmeter and ammeter used can be part of the system 100 externally or may be stand-alone devices. When connected, the system 100 initially determines (202) value of voltage and current of the battery. Based on the determined value of the voltage and battery, the system 100 further determines (204) state of the battery as one of 'charging', 'discharging', and 'rest'. If the determined value of current is non-zero, then the system 100 considers the battery as in operations mode, and if the determined value of current is 'zero', then the system 100 determines the battery as in the state of 'rest'. If the battery in the operations mode is drawing current from an external power supply, then the system 100 determines that the battery is in the 'charging' state. If the charge is coming out of the battery, then the system 100 determines the battery as in 'discharging' state.

Further the system 100 determines (206) value of at least one of a plurality of parameters including cumulative charge ($Q_{char}$), time elapsed ($T_{elap}$), Operation time ($T_{opn}$), and Charging Time ($T_{opn\_ch}$). If the battery is in the discharging state, the system 100 checks whether the determined value of the voltage (V) exceeds a minimum threshold of voltage ($V_{min}$). If V exceeds $V_{min}$, then the system 100 determines values of $Q_{char}$, time elapsed $T_{elap}$, and $T_{opn}$ as:

$$Q_{charge} = Q_{charge_{prev}} \tag{1}$$

$$T_{opn} = T_{curr} + T_{prev_{opn}} \tag{2}$$

$$T_{elap} = T_{elap_{prev}} \tag{3}$$

The charging time ($T_{opn\_ch}$) is one of a charging time if the battery is in charging state, discharging time if the battery is in discharging state, and elapsed time if the battery is in the state of rest. Based on state of the battery, one of the aforementioned three values is determined as:

1. For charging state:
If the battery is in 'charging' state and if (V≤maximum threshold of voltage ($V_{max}$)), then $$T_{opn\_ch} = T_{opn\_ch\_prev} + T_{-curr} \tag{4}$$

2. For discharging state:
If the battery is in discharging state and if V≥$V_{min}$, $$T_{opn\_dis} = T_{opn\_dis\_prev} + T_{-curr} \tag{5}$$

3. For battery in the state of rest:

$$T_{elapsed} = T_{-elapsed\_prev} + T_{-curr} \tag{6}$$

Values of $V_{min}$ and $V_{max}$ may be manufacture-specified.

If V is less than $V_{min}$, then the system 100 terminates the process of SOH and RUL estimation. If the battery is in the state of 'rest', then the system 100 determines value of only the time elapsed (Telap), as:

$$T_{elap} = T_{curr} + T_{elap_{prev}} \tag{7}$$

If the battery is in the 'charging' state, then the system 100 checks whether the determined value of the voltage (V) is less than a maximum threshold of voltage ($V_{max}$) i.e. whether V<$V_{max}$. If V is less than $V_{max}$, then the system 100 determines values of $Q_{char}$, time elapsed $T_{elap}$, and $T_{opn}$ as:

$$Q_{charge} = Q_{curr} + Q_{char_{prev}} \tag{8}$$

$$T_{opn} = T_{curr} + T_{prev} \tag{9}$$

$$T_{elap} = T_{elap_{prev}} \tag{10}$$

Figure 4:
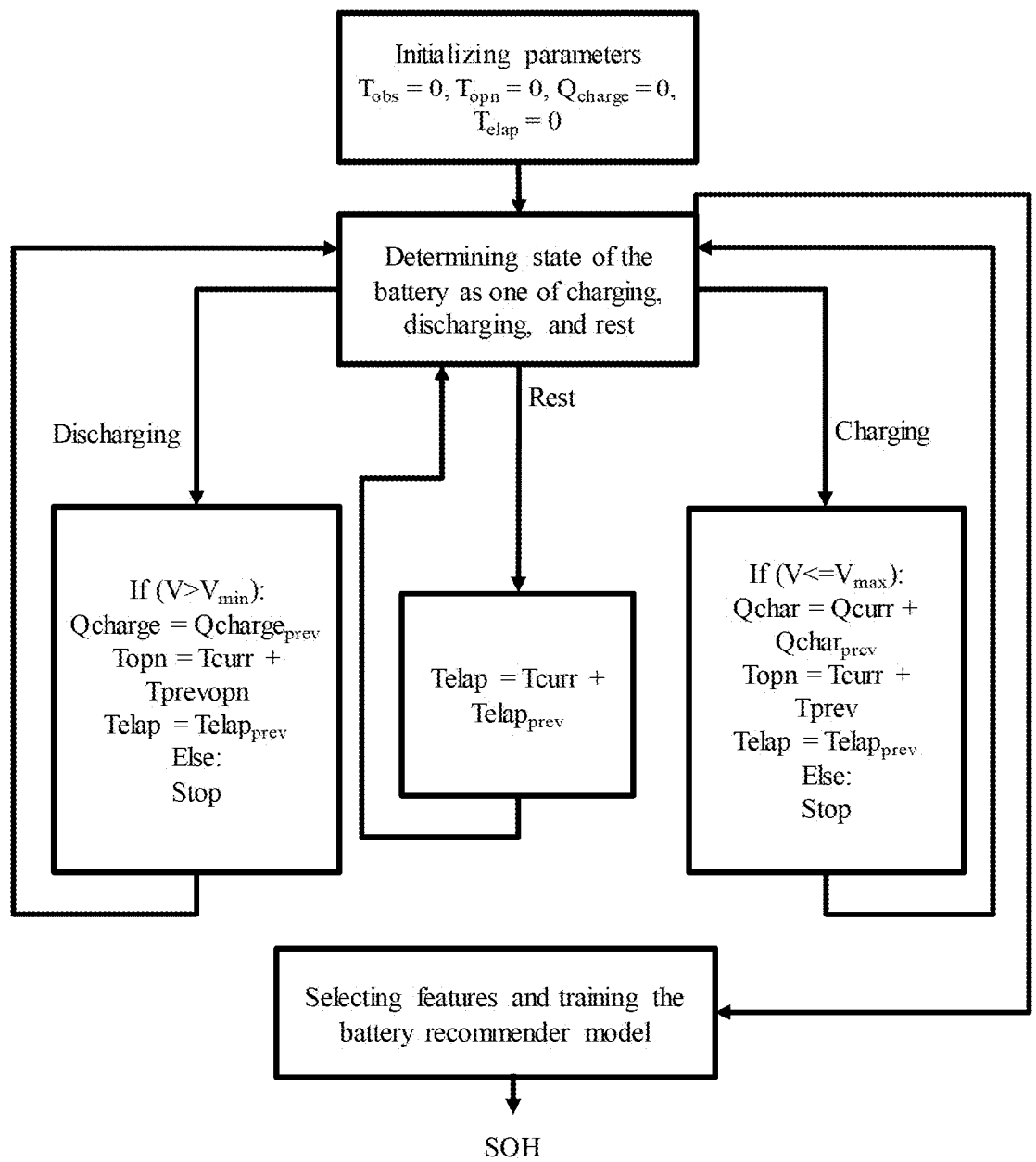
FIG. 4 is an example flow diagram depicting calculation of various parameters for determining the SOH for different states of the battery, using the process in FIG. 2 and the system in FIG. 1, in accordance with some embodiments of the present disclosure.

If V exceeds $V_{max}$, then the system 100 terminates the process of SOH and RUL estimation. The type of parameters determined for each state of the battery and the equations (1) through (10) are depicted in FIG. 4. The equations for $T_{opn\_ch}$ are not depicted in FIG. 4, however they are used when needed.

In the next step, the system 100 determines (208) correlation of the determined value of at least one of the $Q_{char}$, $T_{elap}$, $T_{opn}$, and $T_{opn\_ch}$ with the battery performance model. The battery performance model has data pertaining to one or more SOH and RUL determined at one or more past instance of time and corresponding values of the $Q_{char}$, $T_{elap}$, and $T_{opn}$ parameters, for the same battery and/or a plurality of batteries including the battery for which the SOH and RUL estimation is being performed. While determining the correlation, the system 100 searches for and identifies matching values of the one or more parameters being considered, and based on a match found, determines (210) the corresponding SOH as the SOH of the battery.

Figure 3:
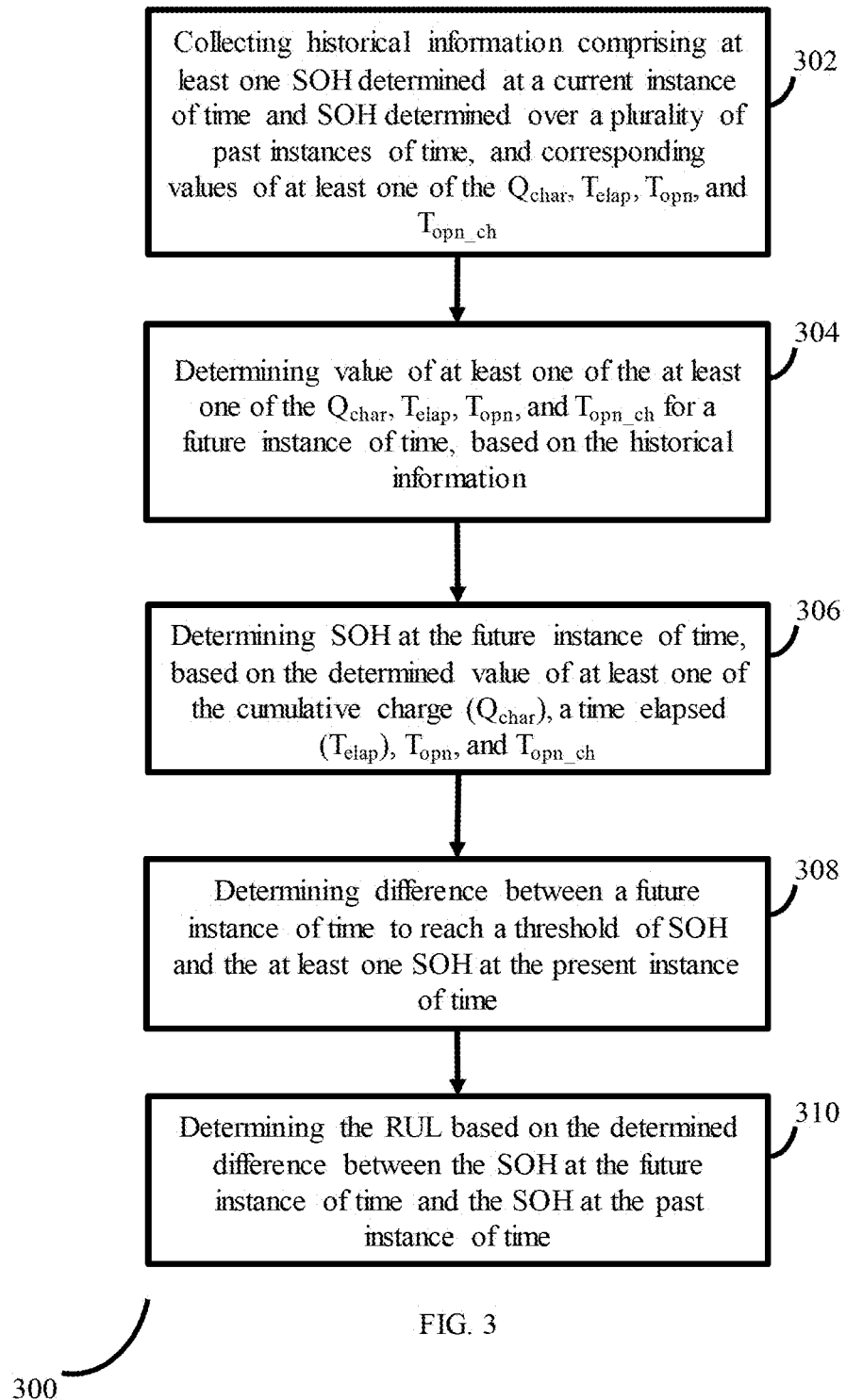
FIG. 3 is a flow diagram depicting steps involved in the process of determining the RUL from a determined SOH of the battery, in accordance with some embodiments of the present disclosure.

In the next step, the system 100 determines (212) the RUL of the battery. This process is depicted in FIG. 3. The system 100 determines the RUL based on a rate of deterioration of SOH of the battery over a period of time. The system 100 collects (302) historical information pertaining to at least one SOH determined for the battery being monitored, at a current instance of time (i.e. real-time online estimation) and over a plurality of past time instances. In an embodiment, multiple SOH values determined over a period of time are used by the system 100 for the RUL estimation. The system 100 subtracts the SOH determined (304) at step 210 (referred to as 'SOH determined at a future instance of time (step 306 in in FIG. 3') from the at least one SOH determined during at least one past instance of time. The system 100 then determines (308) difference between future instance of time to reach a SOH Threshold (which is predetermined by user manufacturer) for the first time and the at least one SOH at the current instance of time, and based on the determined difference, determines (310) the RUL of the battery. The system 100 may use a suitable approach/technique such as but not limited to normal distribution approximation technique to determine the SOH and value of associated parameters at the future instance of time, and the determined values are used to further determine the RUL. The determined value of SOH and RUL are further used by the system 100 to update the battery performance model. This is depicted in FIG. 4.

Experimental Results:

| | | | | | Derived tags | | | Features | |
|---|---|---|---|---|---|---|---|---|---|
| Absolute time (seconds) | Voltage | Current | Profile (Charging (C)/ Discharging (D)/ Rest (R)) | Time (Relative in sec) | Cumulative elapsed time | Cumulative charge-in (Amp-Sec) | Total charge time (sec) | Elapsed Time Ratio | Mean Cumulative Charge Load |
| 3000 | 3.2-4.2 V | 2 A | C | 3000 | 0 | 6000 | 3000 | 0 | 2 |
| 4000 | 4.2-4.2 V | 0 | R | 1000 | 1000 | 6000 | 3000 | 0.25 | 2 |
| 5500 | 4.2-3.5 V | 3 A | D | 1500 | 1000 | 6000 | 3000 | 0.181818182 | 2 |
| 5600 | 3.5-3.4 V | 4 A | D | 100 | 1000 | 6000 | 3000 | 0.178571429 | 2 |
| 8100 | 3.4-4.2 V | 2.5 A | C | 2500 | 1000 | 12550 | 5500 | 0.12345679 | 2.227272727 |
| 10100 | 4.2-4.2 V | 0 | R | 2000 | 3000 | 12550 | 5500 | 0.297029703 | 2.227272727 |
| 11600 | 4.2-3.4 V | 3 A | D | 1000 | 3000 | 12550 | 5500 | 0.25862069 | 2.227272727 |

Table. 1 shows results of method of extraction of features including Elapsed Time ratio and total or cumulative charge ratio in. It is to be noted that these two features are considered only for example purpose, however other appropriate parameters also can be used by the system 100. Cumulative nature of these two features makes implementation of the battery performance model easier and convenient. During a first point, a charging instance of 2 A is considered, where voltage of the battery rose from 3.2 V to 4.2 V. This instance leads to a positive change of 6000 Amp-sec in the total charge-in and elapsed time which accounts for resting period stood at 0 Sec. Second point refers to the resting period and hence leads to an elapsed time of 1000 sec with no change in cumulative charge-in. Third and fourth cycles refer to discharge by a constant current of 3 A and 4 A respectively, hence no change in both the features is witnessed. Fifth cycle refers to the charging by 2.5 A for a duration of 2500 Sec, which lead to a change in cumulative charge in to 12250. Sixth cycle again is another rest cycle which changes the elapsed time to 3000 Sec with no change in seventh cycle of discharging.

For online measurement, it may not be directly possible to calculate the elapsed time. A flag based mechanism is used by the system 100 to overcome this issue, and is explained below:

a. Keep a check on current and voltage of the battery and compare instantaneous voltage of the battery.
 b. If, there is some charging or discharging happening in the battery, then Elapsed time remains at its previous value. Otherwise if the battery is at rest (not loaded or getting charged), elapsed time increases with resting time.
 c. Add Elapsed time with previous value, whenever charging and discharging commences.

Figure 5A:
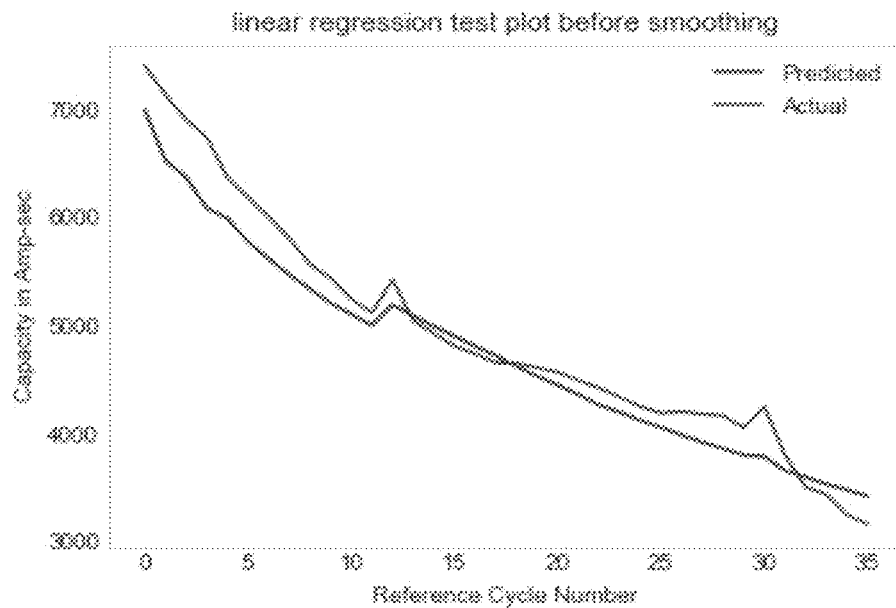
FIGS. 5A through 5F are graphs depicting values of different parameters as estimated by the system of FIG. 1 during the battery monitoring and SOH and RUL estimation, using the process in FIG. 2, in accordance with some embodiments of the present disclosure.

Results of SOH prediction done by the system 100 is depicted in FIG. 5A.

Remaining useful Life (RUL)—of the battery refers to the capacity fade, where capacity degrades to less than a certain value (for example, 80%) of rated capacity of the battery. RUL requires prediction of SOH at future states i.e. at future instances of time. Most of the time, these predictions come with an upper and lower bound, which talks about the degree of uncertainty in the predicted value and the predictions are supposed to lie within this defined bound.

Figure 5B:
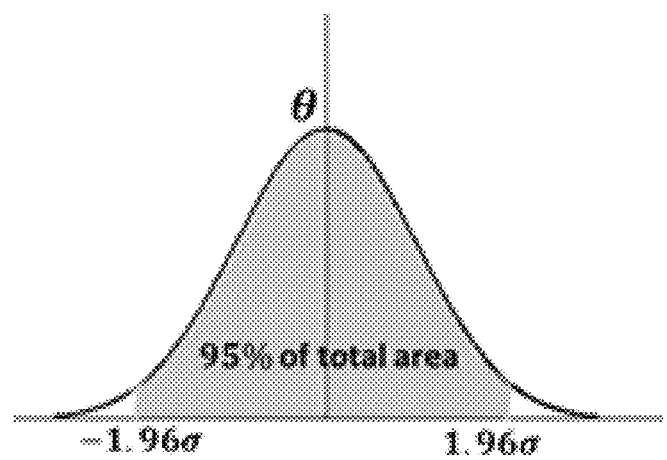

The system 100 uses a normal distribution approximation in this scenario. (as depicted in FIG. 5B), standard deviations (1.96 to be exact) account for 95% of the area coverage w.r.t. mean. Considering the same analogy, at time t_1, θ refers to the mean value of an engineered feature (elapsed time for ex.) w.r.t total cumulative time, then upper and lower bound of the feature are given by θ±2σ, where σ refers to the standard deviation from the mean as shown in FIG. 5B.

A RUL algorithm used by the system 100 uses predicted value of state parameters to estimate state of health of the battery at any future instance of time. The algorithm works on the battery performance model, and predicts state of health of the battery based on estimated state variables value.

TABLE 2

| Elapsed Time Ratio | Charge Time Ratio | Absolute Time | Cumulative Charge Time | Mean Cumulative Load |
|---|---|---|---|---|
| 0.14 | 0.25 | 4000000 | 1000000 | 1.9 |
| 0.15 | 0.25 | 4000000 | 1100000 | 1.85 |
| 0.16 | 0.245 | 4000000 | 1176000 | 1.84 |
| 0.22 | 0.2 | 600000 | 120000 | 1.7 |
| 0.23 | 0.2 | 6500000 | 1300000 | 1.6 | a. First, state variables are identified, value of which need to be predicted based on fixed values of other state variables. For example, in the case of mean cumulative charge and elapsed time ratio as state variables, the elapsed time ratio is predicted based on historical data for given value of cumulative charge. Mean cumulative charge load is also predicted based on ratio of charging time to absolute time, using the battery performance model. Likewise, other parameters also are calculated.
 b. Define values of state variables, as mentioned in the Table. 2. Here, every row in the table defines a specific time when SOH prediction needs to be made, based on estimated value of SOH at a given starting time with cumulative charge of 11000 units. Cumulative charge column gives the point of prediction for RUL, second column gives the estimated mean value of elapsed time when battery is cumulatively charged to the given number based on historical data and is given by θ.
 c. Third and fourth columns give upper and lower bound on mean value as θ±1.96σ respectively.

Figure 5C:
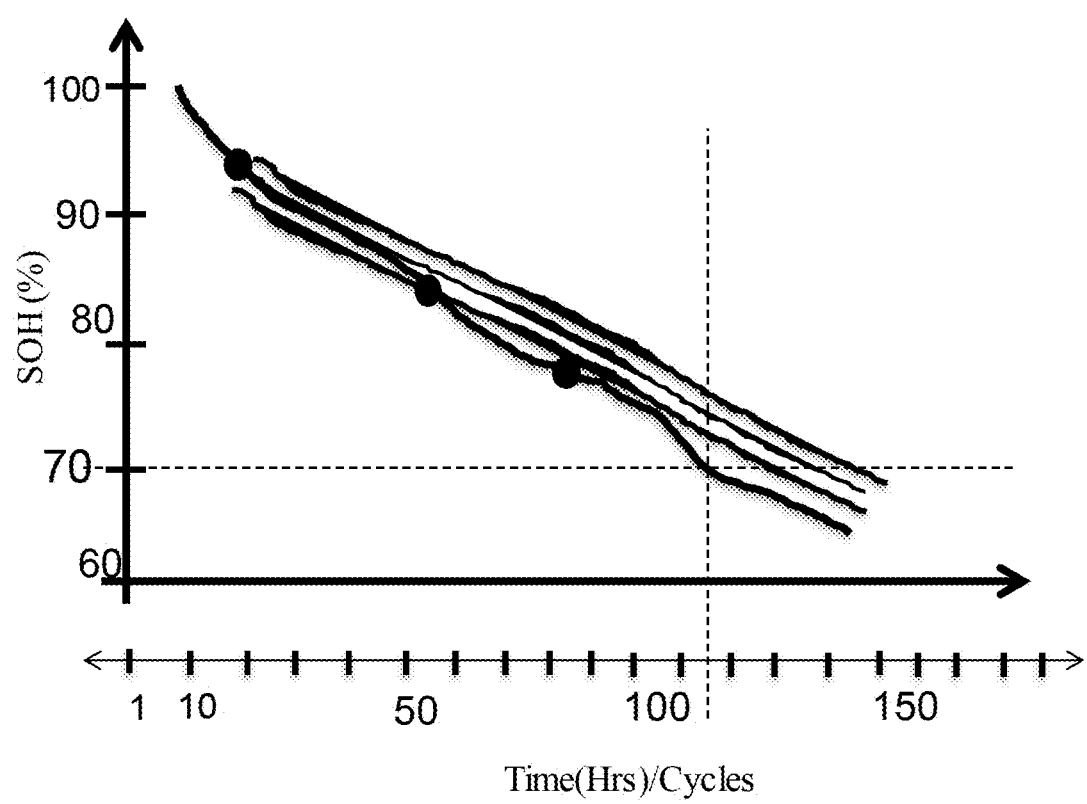

Further in next steps, the battery performance model is used to determine value of SOH at a future instance of time under certain defined usage conditions. The 'usage conditions' are assumptions that usage pattern of the battery being monitored is same as at least one usage pattern previously recorded i.e. a historical usage pattern, which is part of the historical data. Also, sometimes manufacturers of batteries may specify End of Life (EOL) of battery as 70% or 50% of a rated capacity. This information also is taken as input by the system 100 and is used for the RUL estimation). Graphs in FIG. 5C, show behavior of the battery performance model with progressing cycles. Though, with less cycle information, there can be some error in accurate predictions, but with every passing cycle the battery performance model self-learns and gives more accurate results.

Figure 5D:
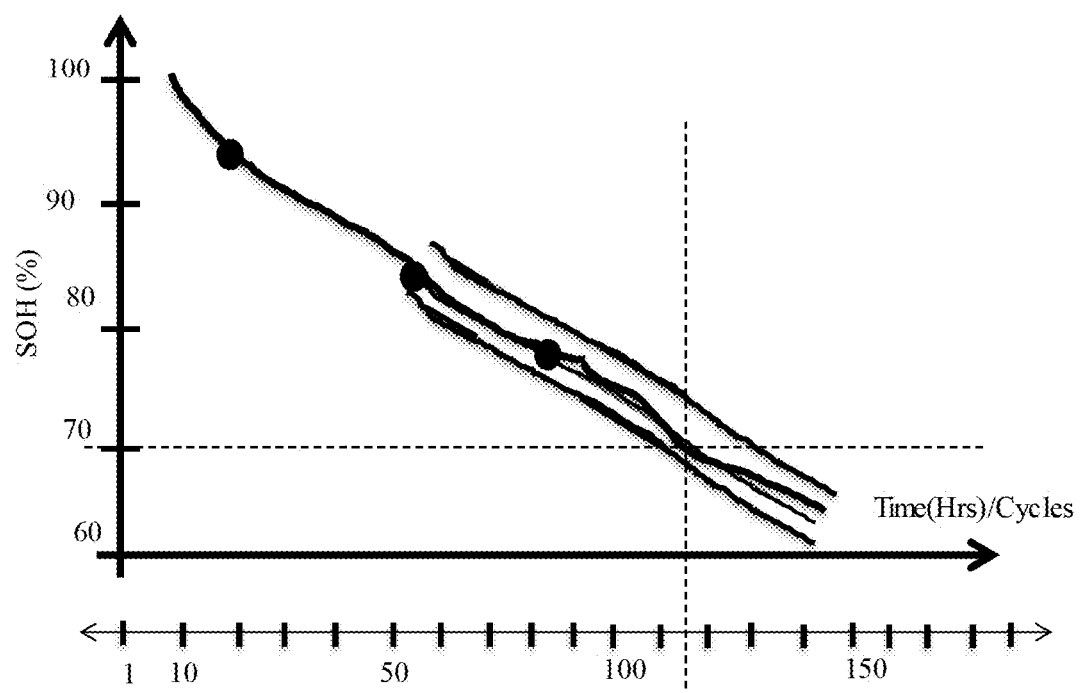
Figure 5E:
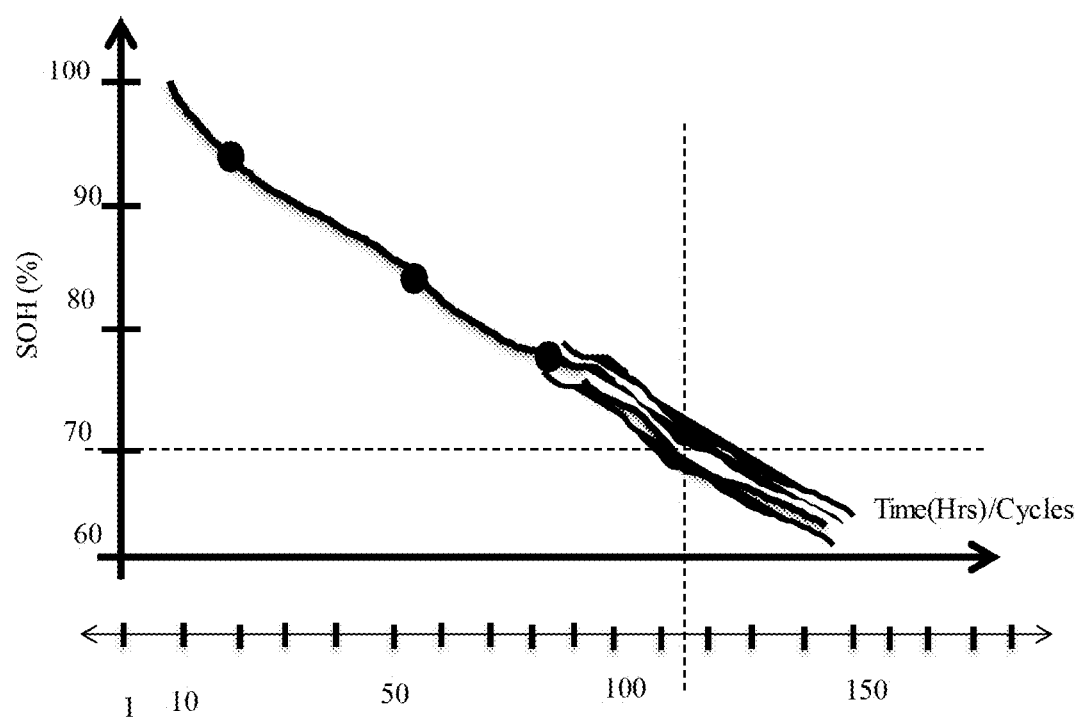
Figure 5F:
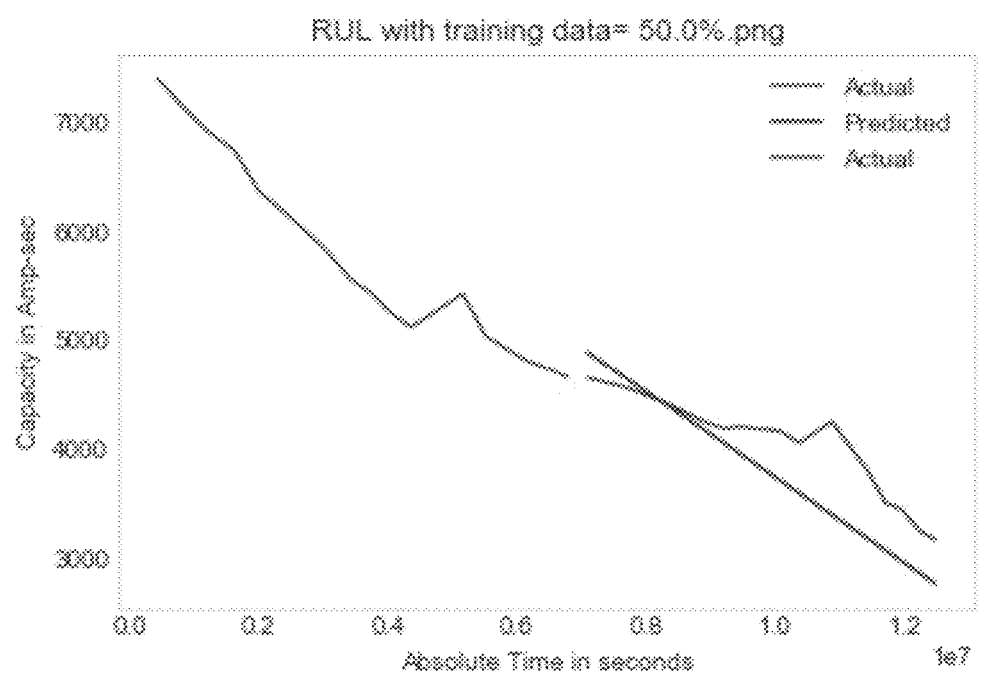

RUL of the battery is predicted using above mentioned procedure for all the cycles. To estimate between any two cycles, the RUL is estimated at cycle n and cycle n−1 and then linearly interpolated in between as shown in FIG. 5D. FIG. 5E shows result of the RUL estimation performed by the system 100. (50% of data is used for training the battery performance model and the ratios and future parameters are calculated. The calculated values are used to predict the SOH of the battery at a future instance of time. As in FIG. 5E, end of actual capacity is considered as End of battery life. Error in RUL prediction for 50% training data was observed as 9 days.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated by the following claims.

What is claimed is:

1. A processor implemented method for online battery management, comprising:
    determining real-time value of voltage and current of a battery being monitored, via one or more hardware processors;
    determining a state of the battery as at least one of charging, discharging, and rest, via the one or more hardware processors, based on the determined real-time value of at least one of the current and voltage;
    determining value of at least one of a cumulative charge ($Q_{char}$), a time elapsed ($T_{elap}$), Operation time ($T_{opn}$), and Charging Time ($T_{opn\_ch}$) based on the determined state of the battery, via the one or more hardware processors; and
    processing the determined value of the at least one of the $Q_{char}$, $T_{elap}$, $T_{opn-}$, and $T_{opn\_ch}$ with a battery performance model to determine a State of Health (SOH) and Remaining Useful Life (RUL) of the battery, via the one or more hardware processors, the processing comprising:
        determining correlation of the determined value of the at least one of the $Q_{char}$, $T_{elap}$, $T_{opn}$, and $T_{opn\_ch}$ with the battery performance model, wherein the battery performance model is used to determine value of the SOH at a future instance of time under certain usage conditions, wherein the certain usage conditions are assumptions that a usage pattern of the battery being monitored is same as at least one usage pattern based on historical information;
        determining the SOH of the battery based on the determined correlation; and
        determining the Remaining Useful Life (RUL) of the battery based on the determined SOH of the battery.

2. The method as claimed in claim 1, wherein the value of the $Q_{char}$, $T_{elap}$, $T_{opn-}$, and $T_{opn\_ch}$ are determined if the determined state of the battery is at least one of charging and discharging.

3. The method as claimed in claim 1, wherein the value of the $T_{elap}$ is determined if the determined state of the battery is 'rest'.

4. The method as claimed in claim 1, wherein the battery performance model is a machine learning model trained using training data comprising historical data pertaining to a plurality of SOH and RUL of at least one battery and value of a plurality of Key Variables of Interest (KVI) for each of the plurality of SOH and RUL.

5. The method as claimed in claim 1, wherein determining the RUL based on the determined SOH of the battery comprises:
    collecting the historical information, wherein the historical information comprises at least one SOH of the battery determined at a past time instance, and values of the cumulative charge ($Q_{char}$), the time elapsed ($T_{elap}$), the $T_{opn}$, and the $T_{opn\_ch}$ corresponding to the determined at least one SOH;
    determining values of the cumulative charge ($Q_{char}$), the time elapsed ($T_{elap}$), the $T_{opn}$, and the $T_{opn\_ch}$ for the future instance of time, based on the historical information;
    determining the SOH at the future instance of time, based on the determined values of the cumulative charge ($Q_{char}$), the time elapsed ($T_{elap}$), the $T_{opn}$, and the $T_{opn\_ch}$; and
    processing the determined SOH and the determined values of $Q_{char}$, $T_{elap}$, $T_{opn}$, and the $T_{opn\_ch}$ using the battery performance model, comprising:
        comparing the SOH determined for the future instance of time with the at least one SOH determined at the past instance of time;
        determining difference between the SOH determined for the future instance of time and the at least one SOH determined at the past instance of time; and
        determining the RUL of the battery based on the determined difference between the SOH determined for the future instance of time and the at least one SOH determined at the past instance of time.

6. A system for online battery management, comprising:
    a memory storing instructions;
    one or more communication interfaces; and
    one or more hardware processors coupled to the memory via the one or more communication interfaces, wherein the one or more hardware processors are configured by the instructions to:
        determine real-time value of voltage and current of a battery being monitored;
        determine a state of the battery as at least one of charging, discharging, and rest, based on the determined real-time value of at least one of the current and voltage;
        determine value of at least one of a cumulative charge ($Q_{char}$), a time elapsed ($T_{elap}$), Operation Time ($T_{opn-}$), and Charging Time ($T_{opn\_ch}$) based on the determined state of the battery; and
        process the determined value of the at least one of the $Q_{char}$, $T_{elap}$, $T_{opn}$, and $T_{opn\_ch}$ with a battery performance model to determine a State of Health (SOH) and Remaining Useful Life (RUL) of the battery, the processing comprising:
            determining correlation of the determined value of the at least one of the $Q_{char}$, $T_{elap}$, and $T_{opn}$ with a battery performance model, wherein the battery performance model is used to determine value of the SOH at a future instance of time under certain usage conditions, wherein the certain usage conditions are assumptions that a usage pattern of the battery being monitored is same as at least one usage pattern based on historical information;
            determining the SOH of the battery based on the determined correlation; and
            determining the Remaining Useful Life (RUL) of the battery based on the determined SOH of the battery.

7. The system as claimed in claim 6, wherein the system determines value of the $Q_{char}$, $T_{elap}$, $T_{opn}$, and $T_{opn\_ch}$ if the determined state of the battery is at least one of charging and discharging.

8. The system as claimed in claim 6, wherein the system determines the value of the $T_{elap}$ if the determined state of the battery is 'rest'.

9. The system as claimed in claim 6, wherein the battery performance model is a machine learning model trained using training data comprising historical data pertaining to a plurality of SOH and RUL of at least one battery and value of a plurality of Key Variables of Interest (KVI) for each of the plurality of SOH and RUL.

10. The system as claimed in claim 6, wherein the system determines the RUL based on the determined SOH of the battery by:
    collecting the historical information, wherein the historical information comprises at least one SOH of the battery determined at a past time instance, and values of the cumulative charge ($Q_{char}$), the time elapsed ($T_{elap}$), the $T_{opn}$, and the $T_{opn\_ch}$ corresponding to the determined at least one SOH;
    determining values of the cumulative charge ($Q_{char}$), the time elapsed ($T_{elap}$), the $T_{opn}$, and the $T_{opn\_ch}$ for the future instance of time, based on the historical information;
    determining the SOH at the future instance of time, based on the determined values of the cumulative charge ($Q_{char}$), the time elapsed ($T_{elap}$), the $T_{opn}$, and $T_{opn\_ch}$; and
    processing the determined SOH and the determined values of $Q_{char}$, $T_{elap}$, $T_{opn}$, and the $T_{opn\_ch}$ using the battery performance model, comprising:
        comparing the SOH determined for the future instance of time with the at least one SOH determined at the past instance of time;
        determining difference between the SOH determined for the future instance of time and the at least one SOH determined at the past instance of time; and
        determining the RUL of the battery based on the determined difference between the SOH determined for the future instance of time and the at least one SOH determined at the past instance of time.

11. A non-transitory computer readable medium for battery management, wherein the non-transitory computer readable medium comprising a plurality of instructions which when executed using one or more hardware processors, cause the one or more hardware processors to perform the battery management by:
    determining real-time value of voltage and current of a battery being monitored, via one or more hardware processors;
    determining a state of the battery as at least one of charging, discharging, and rest, via the one or more hardware processors, based on the determined real-time value of at least one of the current and voltage;
    determining value of at least one of a cumulative charge ($Q_{char}$), a time elapsed ($T_{elap}$), Operation time ($T_{opn}$), and Charging Time ($T_{opn\_ch}$) based on the determined state of the battery, via the one or more hardware processors; and
    processing the determined value of the at least one of the $Q_{char}$, $T_{elap}$, $T_{opn}$, and $T_{opn\_ch}$ with a battery performance model to determine a State of Health (SOH) and Remaining Useful Life (RUL) of the battery, via the one or more hardware processors, the processing comprising:
        determining correlation of the determined value of the at least one of the $Q_{char}$, $T_{elap}$, $T_{opn}$, and $T_{opn\_ch}$ with the battery performance model, wherein the battery performance model is used to determine value of the SOH at a future instance of time under certain usage conditions, wherein the certain usage conditions are assumptions that a usage pattern of the battery being monitored is same as at least one usage pattern based on historical information;
        determining the SOH of the battery based on the determined correlation; and
        determining the Remaining Useful Life (RUL) of the battery based on the determined SOH of the battery.

12. The non-transitory computer readable medium as claimed in claim 11, wherein the value of the $Q_{char}$, $T_{elap}$, $T_{opn}$, and $T_{opn\_ch}$ are determined if the determined state of the battery is at least one of charging and discharging.

13. The non-transitory computer readable medium as claimed in claim 11, wherein the value of the $T_{elap}$ is determined if the determined state of the battery is 'rest'.

14. The non-transitory computer readable medium as claimed in claim 11, wherein the battery performance model is a machine learning model trained using training data comprising historical data pertaining to a plurality of SOH and RUL of at least one battery and value of a plurality of Key Variables of Interest (KVI) for each of the plurality of SOH and RUL.

15. The non-transitory computer readable medium as claimed in claim 11, wherein determining the RUL based on the determined SOH of the battery comprises:
    collecting the historical information, wherein the historical information comprises at least one SOH of the battery determined at a past time instance, and values of the cumulative charge ($Q_{char}$), the time elapsed ($T_{elap}$), the $T_{opn}$, and the $T_{opn\_ch}$ corresponding to the determined at least one SOH;
    determining values of the cumulative charge ($Q_{char}$), the time elapsed ($T_{elap}$), the $T_{opn}$, and the $T_{opn\_ch}$ for the future instance of time, based on the historical information;
    determining (306) the SOH at the future instance of time, based on the determined values of the cumulative charge ($Q_{char}$), the time elapsed ($T_{elap}$), the $T_{opn}$, and the $T_{opn\_ch}$; and
    processing the determined SOH and the determined values of $Q_{char}$, $T_{elap}$, $T_{opn}$, and the $T_{opn\_ch}$ using the battery performance model, comprising:
        comparing the SOH determined for the future instance of time with the at least one SOH determined at the past instance of time;
        determining difference between the SOH determined for the future instance of time and the at least one SOH determined at the past instance of time; and
        determining the RUL of the battery based on the determined difference between the SOH determined for the future instance of time and the at least one SOH determined at the past instance of time.

* * * * *